United States Patent
Yasui

(10) Patent No.: US 8,254,128 B2
(45) Date of Patent: Aug. 28, 2012

(54) HEAT-TRANSFER MECHANISM AND INFORMATION DEVICE

(75) Inventor: Maiko Yasui, Atsugi (JP)

(73) Assignee: Ricoh Company, Ltd., Tokyo (JP)

( * ) Notice: Subject to any disclaimer, the term of this patent is extended or adjusted under 35 U.S.C. 154(b) by 191 days.

(21) Appl. No.: 12/760,849

(22) Filed: Apr. 15, 2010

(65) Prior Publication Data

US 2010/0263851 A1 Oct. 21, 2010

(30) Foreign Application Priority Data

Apr. 20, 2009 (JP) .................................. 2009-101703

(51) Int. Cl.
- *H05K 7/20* (2006.01)
- *H05K 7/00* (2006.01)
- *F28F 7/00* (2006.01)
- *H01L 23/495* (2006.01)
- *H01L 23/34* (2006.01)

(52) U.S. Cl. ........ 361/711; 361/718; 361/704; 361/748; 361/719; 165/80.2; 257/675; 257/713

(58) Field of Classification Search .................. 361/704, 361/711, 718, 719, 748; 165/80.2; 257/675, 257/713
See application file for complete search history.

(56) References Cited

U.S. PATENT DOCUMENTS

| | | | | |
|---|---|---|---|---|
| 5,065,279 A | * | 11/1991 | Lazenby et al. | 361/720 |
| 5,307,236 A | * | 4/1994 | Rio et al. | 361/720 |
| 5,402,313 A | * | 3/1995 | Casperson et al. | 361/710 |
| 5,777,844 A | * | 7/1998 | Kiefer | 361/704 |
| 5,969,940 A | * | 10/1999 | Sano et al. | 361/679.52 |
| 6,005,768 A | * | 12/1999 | Jo | 361/679.34 |
| 6,025,991 A | * | 2/2000 | Saito | 361/704 |
| 6,043,981 A | * | 3/2000 | Markow et al. | 361/704 |
| 6,154,365 A | * | 11/2000 | Pollard et al. | 361/704 |
| 6,317,325 B1 | * | 11/2001 | Patel et al. | 361/704 |
| 6,320,748 B1 | * | 11/2001 | Roden et al. | 361/704 |
| 6,618,252 B2 | * | 9/2003 | Choi | 361/719 |
| 6,673,998 B1 | * | 1/2004 | Wu | 174/383 |
| 6,977,815 B2 | * | 12/2005 | Hsu | 361/704 |
| 7,082,034 B2 | * | 7/2006 | Tiwari et al. | 361/719 |
| 7,180,747 B2 | * | 2/2007 | Lee | 361/720 |
| 7,187,553 B2 | * | 3/2007 | Schmidberger | 361/719 |
| 7,209,354 B2 | * | 4/2007 | Wu et al. | 361/697 |
| 7,265,984 B2 | * | 9/2007 | Numata | 361/719 |
| 7,307,844 B2 | * | 12/2007 | Wu | 361/719 |
| 7,310,228 B2 | * | 12/2007 | Chen | 361/695 |
| 7,324,353 B2 | * | 1/2008 | Satoh et al. | 361/816 |
| 7,391,617 B2 | * | 6/2008 | Veh | 361/719 |
| 7,660,114 B2 | | 2/2010 | Watanabe et al. | |
| 7,855,891 B1 | * | 12/2010 | Ayres et al. | 361/711 |

(Continued)

FOREIGN PATENT DOCUMENTS

JP   2007-188998   7/2007

(Continued)

*Primary Examiner* — Bradley Thomas

(74) *Attorney, Agent, or Firm* — Oblon, Spivak, McClelland, Maier & Neustadt, L.L.P.

(57) ABSTRACT

A heat-transfer mechanism which transfers heat of a heat-generating component mounted on a board to a housing includes a heat-transfer plate having a bottom face portion which has contact with the heat-generating component, a first heat-transfer portion which is screwed near one end portion of the housing and a second heat-transfer portion which is screwed near the other end portion of the housing.

14 Claims, 12 Drawing Sheets

U.S. PATENT DOCUMENTS

| | | | |
|---|---|---|---|
| 7,889,503 B2 * | 2/2011 | Nagareda et al. | 361/719 |
| 8,077,476 B2 * | 12/2011 | Yasuda et al. | 361/775 |
| 2001/0028552 A1 * | 10/2001 | Letourneau | 361/704 |
| 2002/0154487 A1 * | 10/2002 | Weischhoff Van Rijn | 361/719 |
| 2006/0187643 A1 * | 8/2006 | Tsurufusa | 361/704 |
| 2006/0256515 A1 * | 11/2006 | Watanabe | 361/683 |
| 2006/0279926 A1 * | 12/2006 | Koo | 361/688 |
| 2007/0291450 A1 * | 12/2007 | Watanabe | 361/688 |
| 2008/0158817 A1 * | 7/2008 | Tsunoda et al. | 361/697 |
| 2008/0253083 A1 * | 10/2008 | Okutsu | 361/687 |
| 2008/0285224 A1 * | 11/2008 | Odanaka et al. | 361/683 |
| 2010/0165578 A1 * | 7/2010 | Kearns | 361/719 |

FOREIGN PATENT DOCUMENTS

JP      2008-288233      11/2008

* cited by examiner

HEAT-TRANSFER MECHANISM AND INFORMATION DEVICE

PRIORITY CLAIM

The present application is based on and claims priority from Japanese Patent Application No. 2009-101703, filed on Apr. 20, 2009, the disclosure of which is hereby incorporated by reference in its entirety.

BACKGROUND OF THE INVENTION

1. Field of the Invention

The present invention relates to a heat-transfer mechanism and an information device, more particularly, to a heat-transfer mechanism which transfers heat of a heat-generating component mounted on a board to a housing and an information device including the heat-transfer mechanism.

2. Description of the Related Art

In a conventional information device, for example, a controller which is incorporated into a device such as a vending machine, as a method of cooling an electric component mounted on a board, a cooling method is often used such as a forced air cooling system which forcibly supplies cooled air to an electronic component by using a cooling fan, for example and a natural cooling method which discharges heat of an electronic component housed in a housing outside the housing via an opening section (vent hole) provided in the housing.

It is necessary, however, to provide a cooling fan in a housing in the forced air cooling method. For this reason, the size of the information device is increased, and it becomes difficult to ensure the silence of the device by the noise when driving the cooling fan. On the other hand, in the natural cooling method, if the information device is placed in a position where an environment is not managed such as outside, air current in the installation environment goes against the upward current from the inside of the housing, which may deteriorate the quality of the information device when the heat is not effectively discharged and a foreign substance enters from the vent hole.

Consequently, a technique, which provides a heat-transfer plate between a heat-generating component and a housing for transferring the heat of the heat-generating component to the housing when the heat-generating component is housed in the sealed housing without using a vent hole, is proposed as described in JP2007-188998A and JP2008-288233A, for example.

Meanwhile, a demand for downsizing and thinning an information device has been recently increased, so that a need for effectively releasing heat of a heat-generating component without increasing a thickness of a housing is increased.

SUMMARY OF THE INVENTION

One embodiment of the present invention provides a heat-transfer mechanism which transfers heat of a heat-generating component mounted on a board to a housing, including: a heat-transfer plate, having: a bottom face portion which has contact with the heat-generating component; a first heat-transfer portion which is screwed near one end portion of the housing; and a second heat-transfer portion which is screwed near the other end portion of the housing.

One embodiment of the present invention also provides an information device, including: a board on which a heat-generating component is mounted; a housing in which the board is housed; and the above-described heat-transfer mechanism which transfers heat of the heat-generating component to the housing.

BRIEF DESCRIPTION OF THE DRAWINGS

The accompanying drawings are included to provide further understanding of the invention, and are incorporated in and constitute a part of this specification. The drawings illustrate an embodiment of the invention and, together with the specification, serve to explain the principle of the invention.

DETAILED DESCRIPTION OF THE PREFERRED EMBODIMENT

Hereinafter, an embodiment of the present invention will be described with reference to FIGS. 1-18. FIGS. 1-3D illustrate appearances of an information device 100 according to an embodiment of the present invention.

This information device 100 is an information device which is built in a digital signage, for example, and includes a housing 200 having a rectangular appearance. In this embodiment, in the XYZ 3D orthogonal coordinate system (refer to FIG. 1), the longitudinal (horizontal width) direction of the housing 200 is a Y-axis direction, the depth direction is an X-axis direction, and the thickness (height) direction is a Z-axis direction.

Regarding this housing 200, the length (Dx) in the X-axis direction is about 176 mm, the length (Dy) in the Y-axis direction is about 268 mm and the length (Dz) in the Z-axis direction is about 25 mm.

Figure 1:
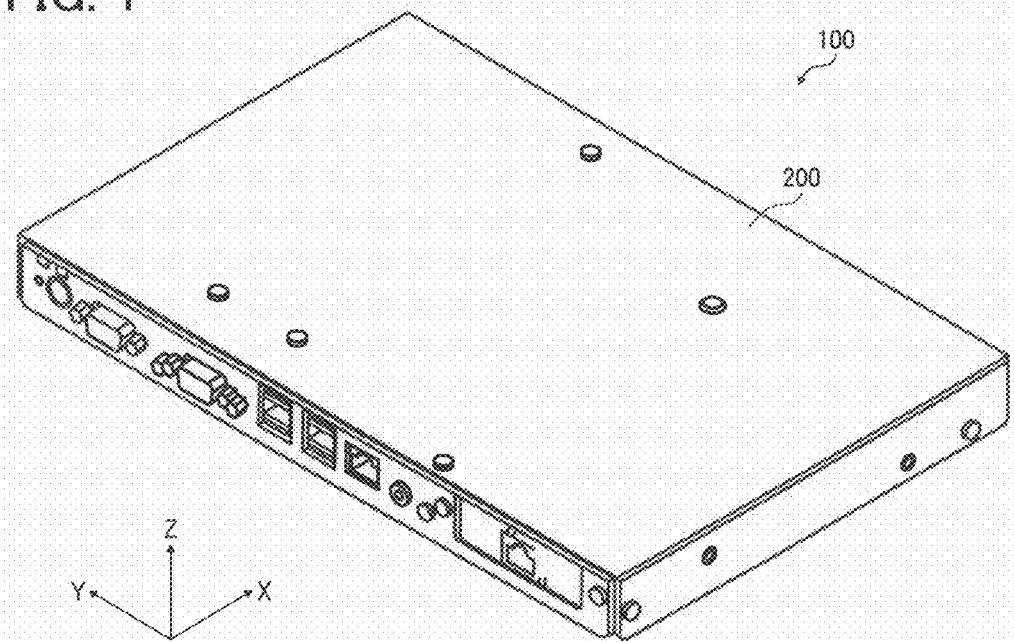
FIG. 1 is a perspective view describing an appearance of an information device according to an embodiment of the present invention.
Figure 2:
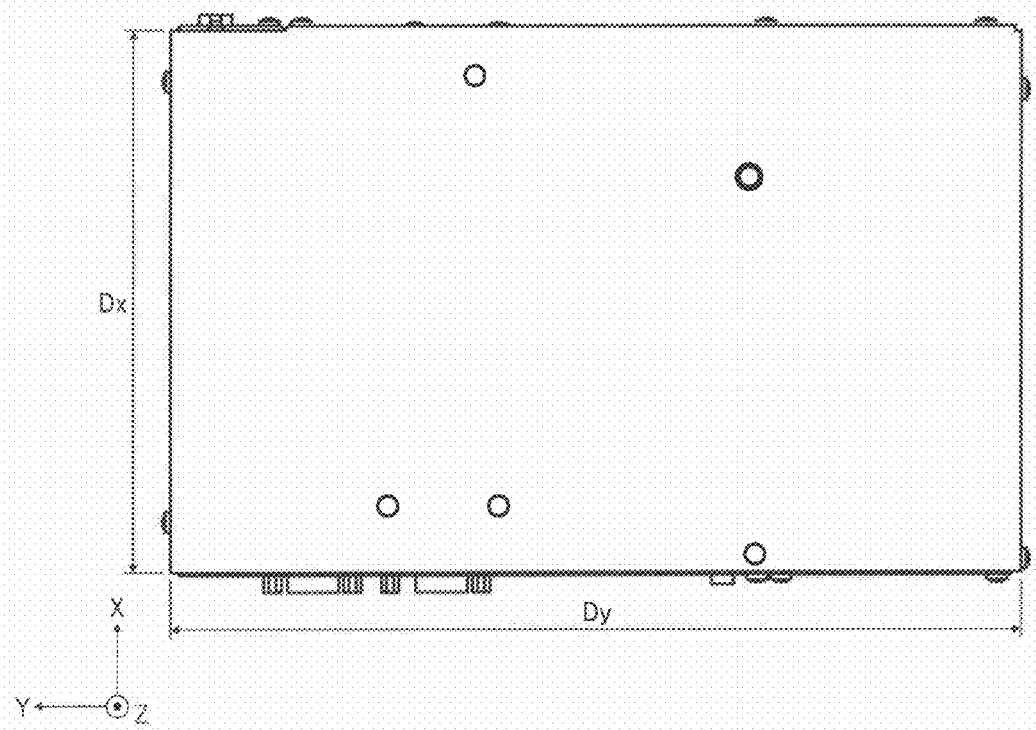
FIG. 2 is a plan view of the information device in FIG. 1.
Figure 3A:
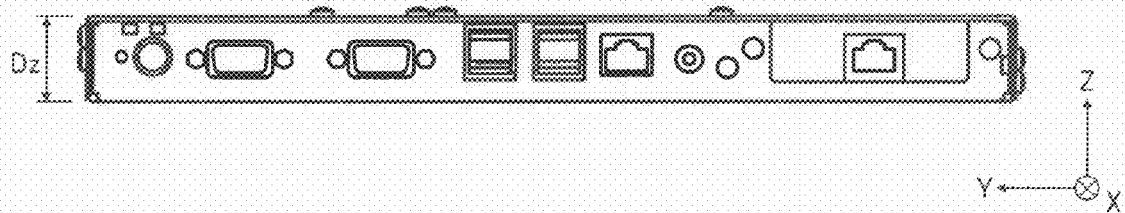
FIG. 3A is a front view of the information device in FIG. 1.
Figure 3B:
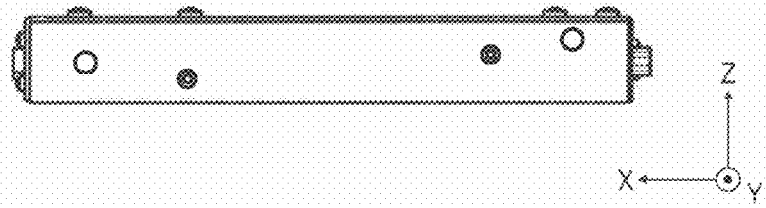
FIG. 3B is a left side view of the information device in FIG. 1.
Figure 3C:
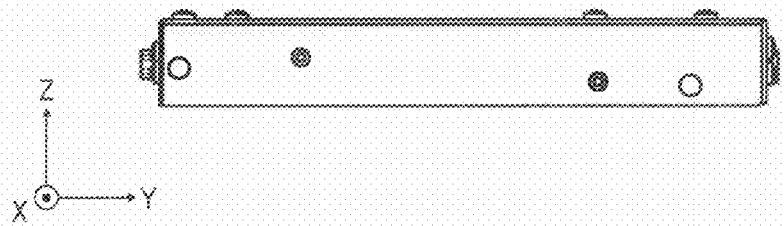
FIG. 3C is a right side view of the information device in FIG. 1.
Figure 3D:
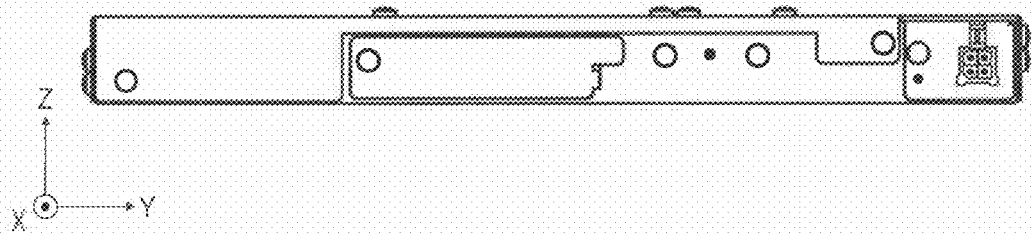
FIG. 3D is a back view of the information device in FIG. 1.
Figure 4:
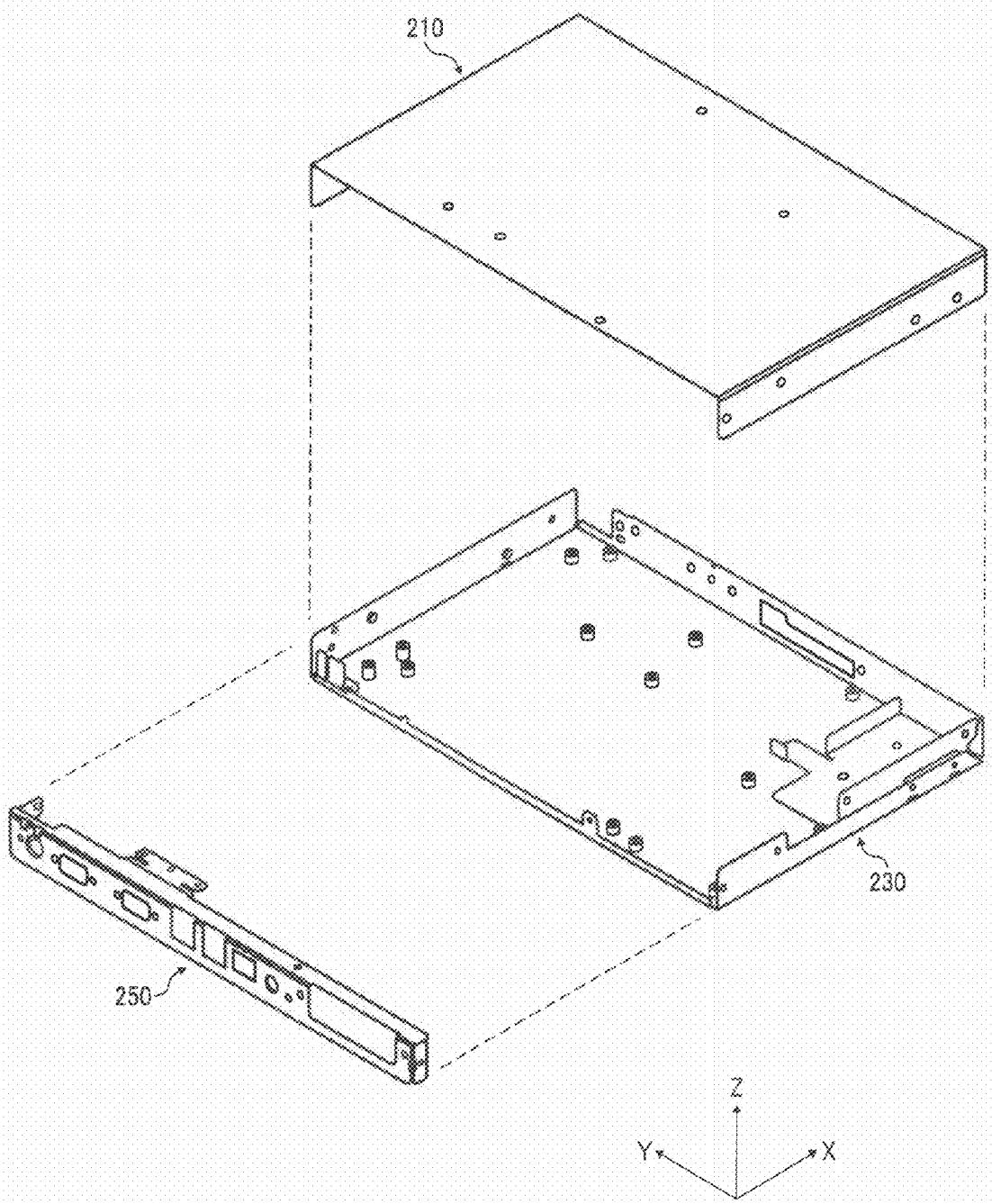
FIG. 4 is a view describing a configuration of a housing.

As illustrated in FIG. 4, the housing 200 includes an upper cover 210, a lower cover 230 and a front face panel 250. In this case, each of the upper and lower covers 210, 230 and the front face panel 250 is formed by processing about a 1-mm-thick anodized aluminum plate. In addition, an electrogalvanized steel plate (SECC) may be used instead of using the aluminum plate.

Figure 5:
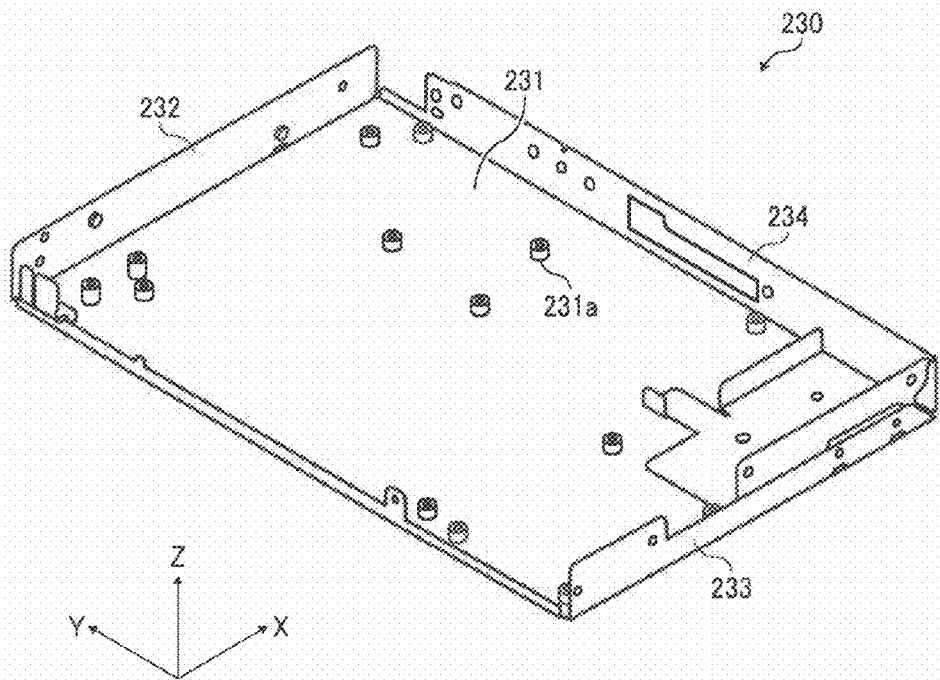
FIG. 5 is a view describing a lower cover of the housing.

The lower cover 230 includes a bottom plate portion 231, two side plate portions 232, 233 and a back face panel portion 234 as illustrated in FIG. 5.

The bottom plate portion 231 has a rectangular shape having a short side in the X-axis direction and a long side in the Y-axis direction. The bottom plate portion 231 includes on the +Z side a plurality of cylindrical columns (about 5 mm in height) 231a each of which has a screw hole in the center thereof.

The side plate portion 232 is a portion which extends to the +Z side along the outer edge of the bottom plate portion 231 on the +Y side.

The side plate portion 233 is a portion which extends to the +Z side along the outer edge of the bottom plate portion 231 on the −Y side.

The back face panel portion 234 is a portion which extends to the +Z side along the outer edge of the bottom plate portion 231 on the +X side.

Figure 6:
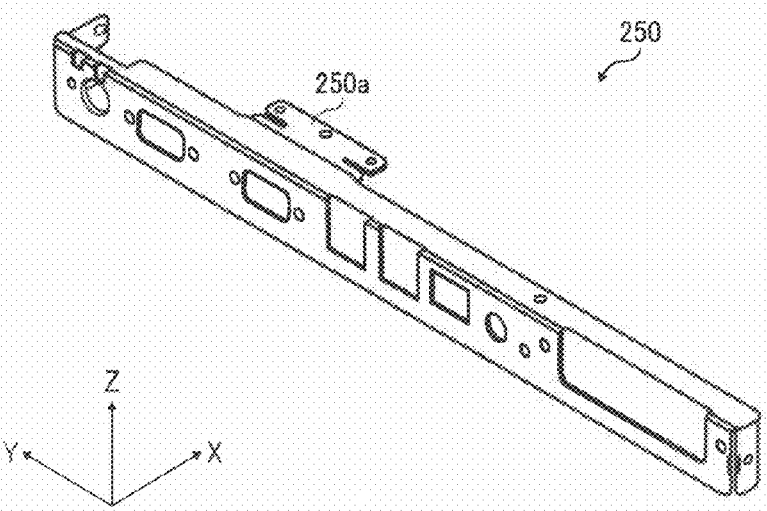
FIG. 6 is a view describing a front panel of the housing.

The front face panel 250 is a rectangular plate-like member having the longitudinal direction as the Y-axis direction. As illustrated in FIG. 6, the front face panel 250 includes an extended portion 250a extending to the +X side as a supporting portion. The extended portion 250a is formed in a part of the peripheral region of the front face panel 250 on the +Z side. This extended portion 250a has a plurality of screw holes.

This front face panel 250 is fitted to the end portion of the bottom plate portion 231 on the −X side to face the back face panel portion 234 of the lower cover 230, and is screwed to the side plate portions 232, 233. Namely, a case is formed by the lower cover 230 and the front face panel 250.

Figure 7:
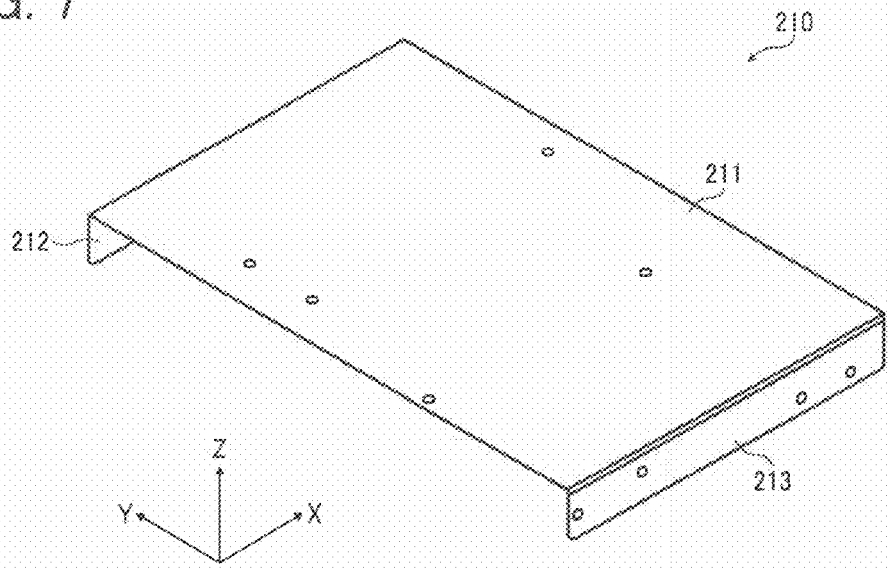
FIG. 7 is a view describing an upper cover of the housing.

The upper cover 210, as illustrated in FIG. 7, includes a top panel portion 211 and two side plate portions 212, 213.

The top panel portion 211 includes a rectangular shape having the short side as the X-axis direction and the long side as the Y-axis direction, similar to the bottom plate portion 231. This top panel portion 211 is a lid of the case.

The side plate portion 212 is a portion which extends to the −Z side along the outer edge of the top panel portion 211 on the +Y side. This side plate portion 212 is screwed to the side plate portion 232 of the lower cover 230.

The side plate portion 213 is a portion which extends to the −Z side along the outer edge of the top panel portion 211 on the −Y side. This side plate portion 213 is screwed to the side plate portion 233 of the lower cover 230.

Figure 8:
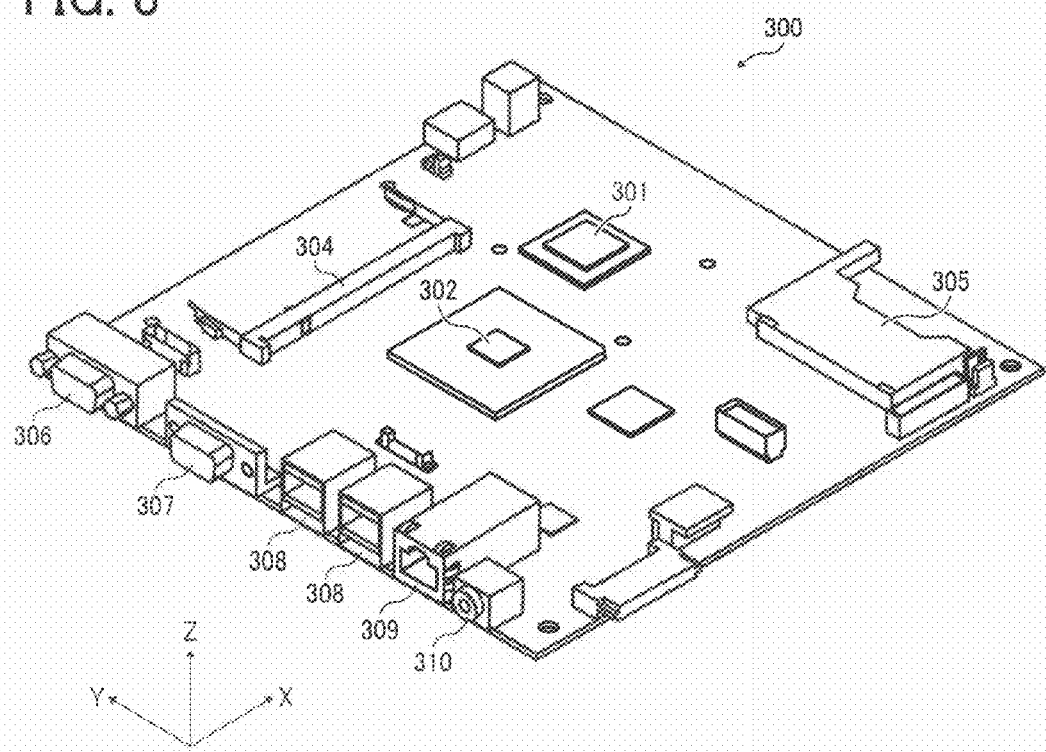
FIG. 8 is a view describing a main board.
Figure 9:
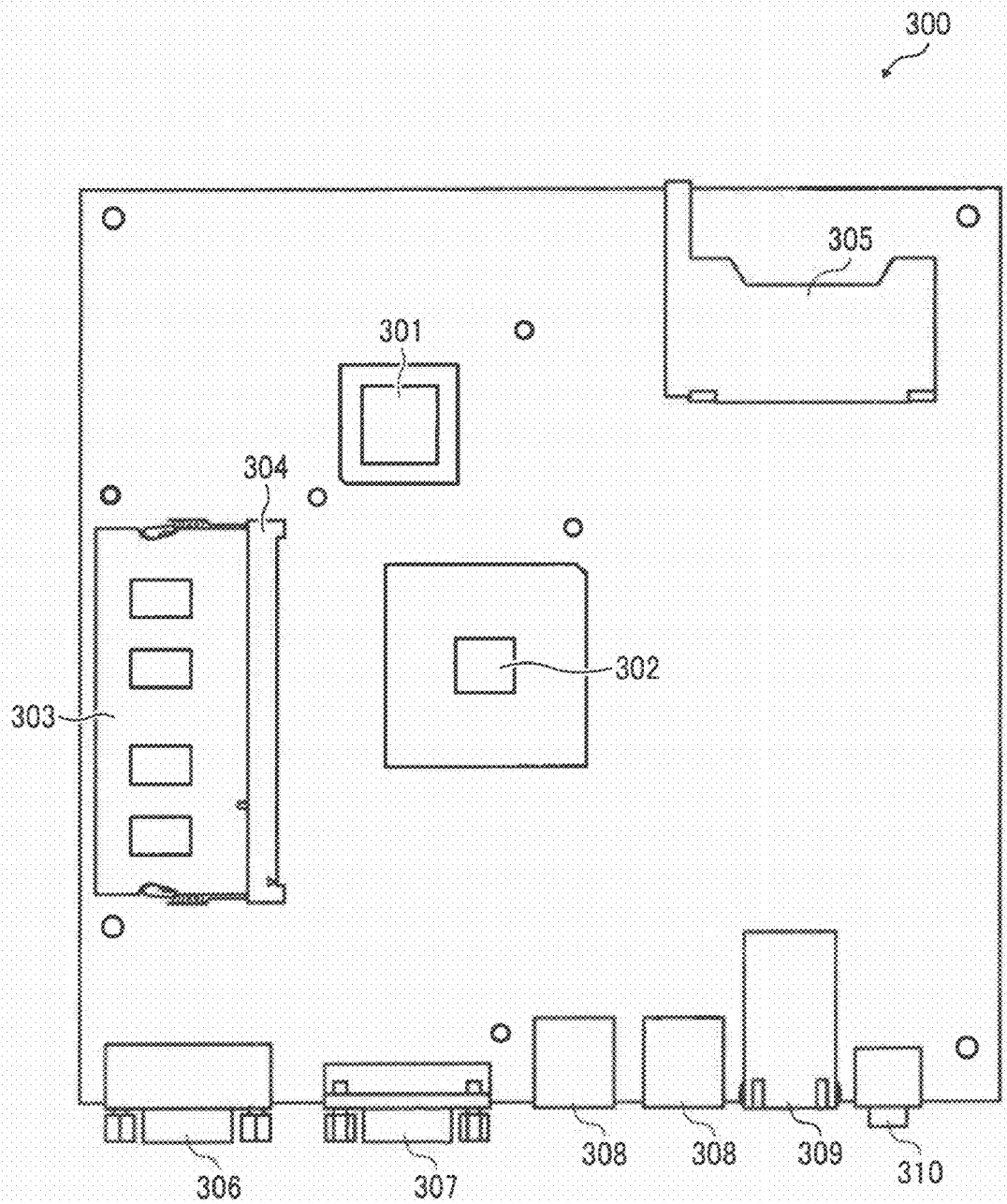
FIG. 9 is another view describing the main board.

The information device 100 includes a main board 300 as an electronic circuit board which is housed in the housing 200 as illustrated in FIGS. 8, 9.

Mounted on the main board 300 are, as illustrated in FIG. 9, a CPU 301, a chip set 302, a memory socket in which a memory board 303 is inserted, a card socket 305 in which a CF card is inserted, a serial input and output terminal 306, an analogue RGB output terminal 307, an USB terminal 308, a LAN connection terminal 309, a sound output terminal 310 and a plurality of electronic components (not shown).

In this case, the memory board 303 is DIMM (Dual Inline Memory Module), i.e., a memory module in which a plurality of DRAM chips is mounted on a printed board.

Figure 10:
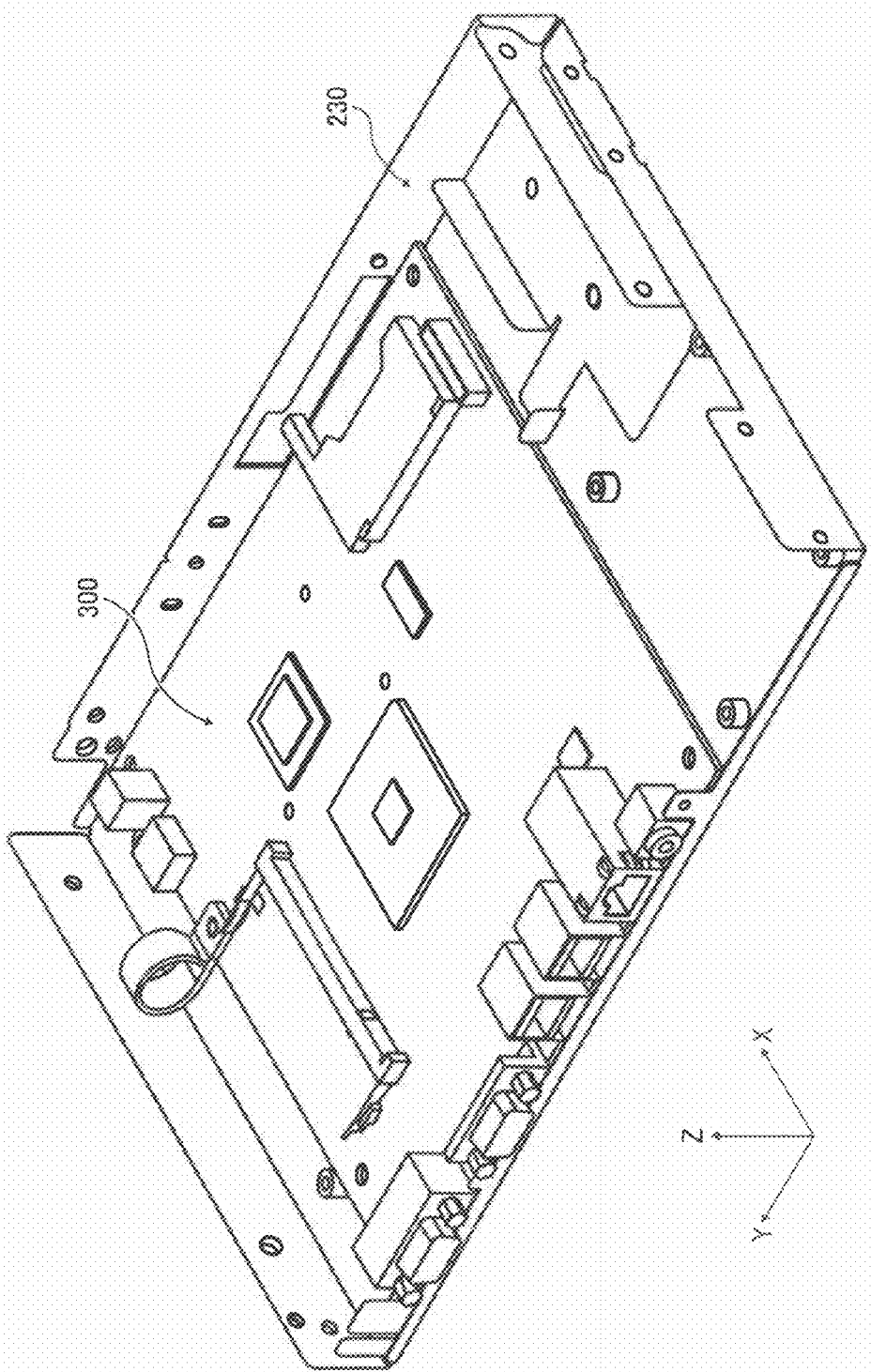
FIG. 10 is a view describing a state in which the main board is attached to the lower cover of the housing.
Figure 11:
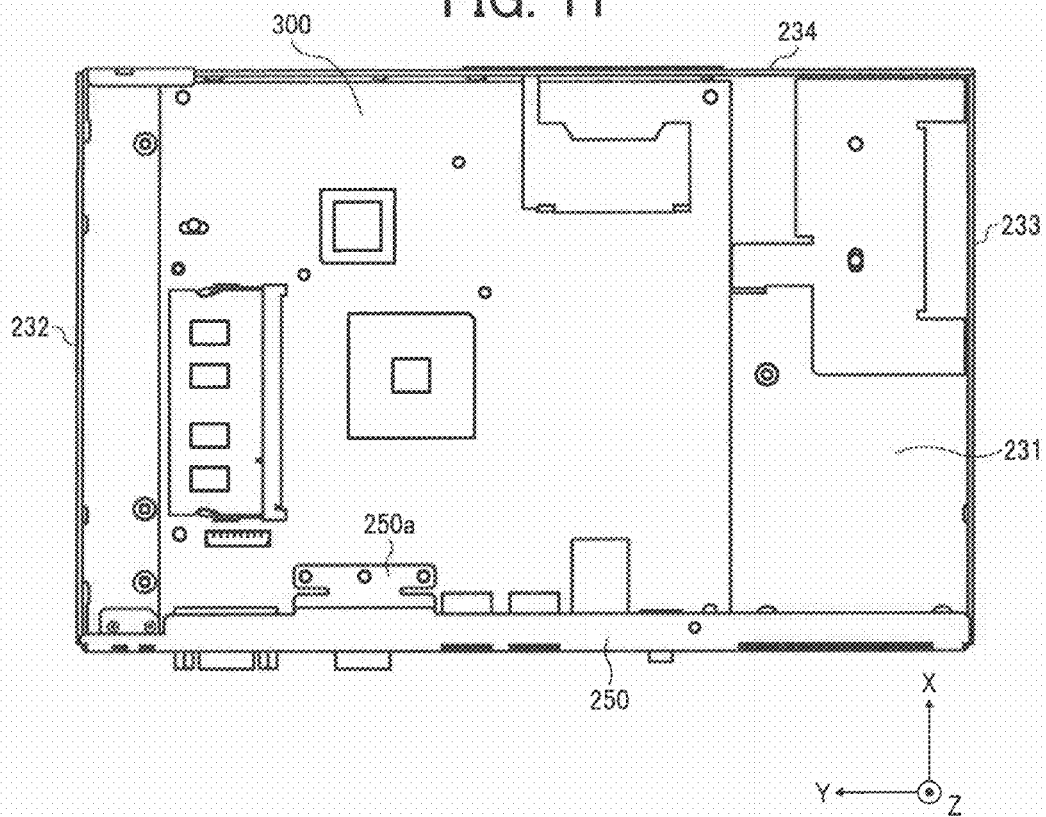
FIG. 11 is a view describing a state in which the main board is housed in a case.

As illustrated in FIG. 10, the main board 300 is placed on a support 231a of the lower cover 230, and is screwed to the support 231a. More particularly, the main board 300 is installed inside the case as illustrated in FIGS. 10, 11.

Figure 12:
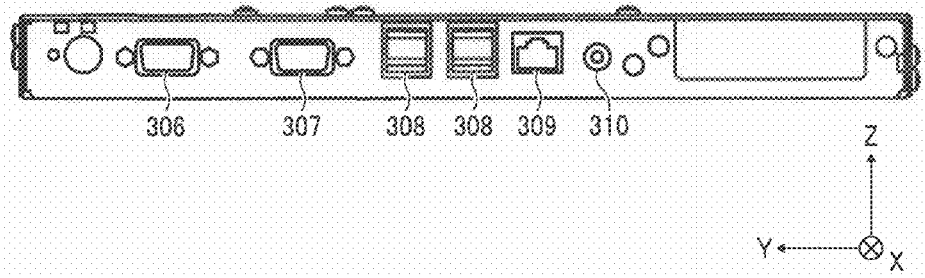
FIG. 12 is another view describing a state in which the main board is housed in the case.
Figure 13:
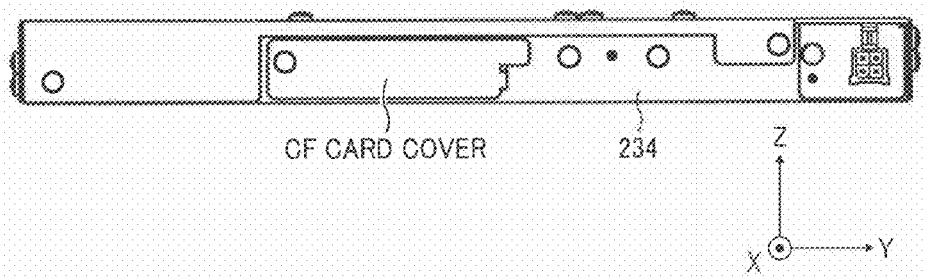
FIG. 13 is a view describing a CF card cover.

The serial input and output terminal 306, the analogue RGB output terminal 307, the USB terminal 308, the LAN connection terminal 309 and the sound output terminal 310 are exposed via the opening portion of the front face panel 250 as illustrated in FIG. 12. By removing a CF card cover provided in the back face panel portion 234, a CF card can be inserted or removed to or from the card socket 305 as illustrated in FIG. 13.

Figure 14:
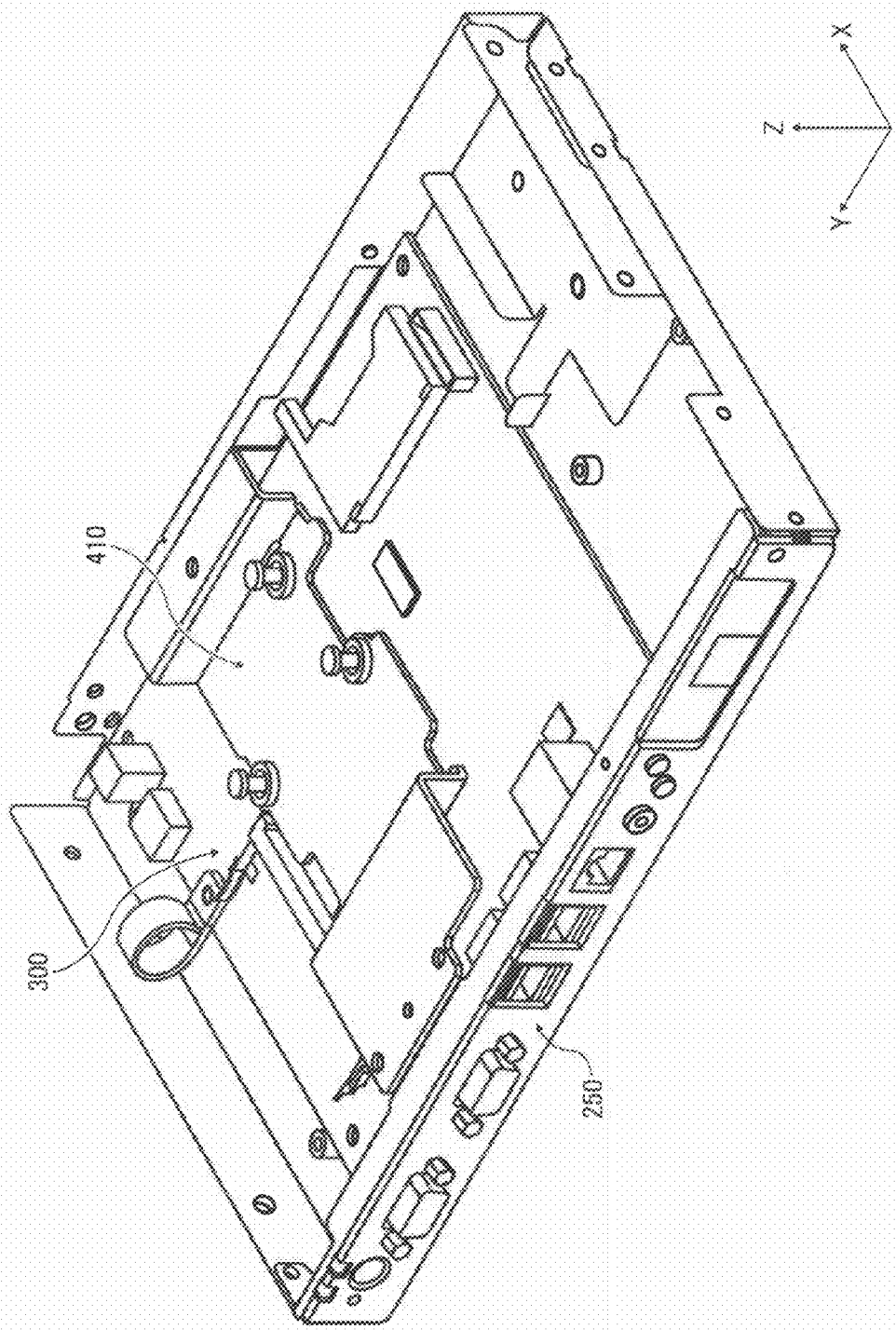
FIG. 14 is a view describing a heat-transfer plate.

As illustrated in FIG. 14, the information device 100 includes a heat-transfer plate 410 which transfers the heat of the CPU 301 and the chip set 302 to the housing 200. This heat-transfer plate 410 is formed by sheet-metal processing a 1-mm-thick anodized aluminum plate.

Figure 15:
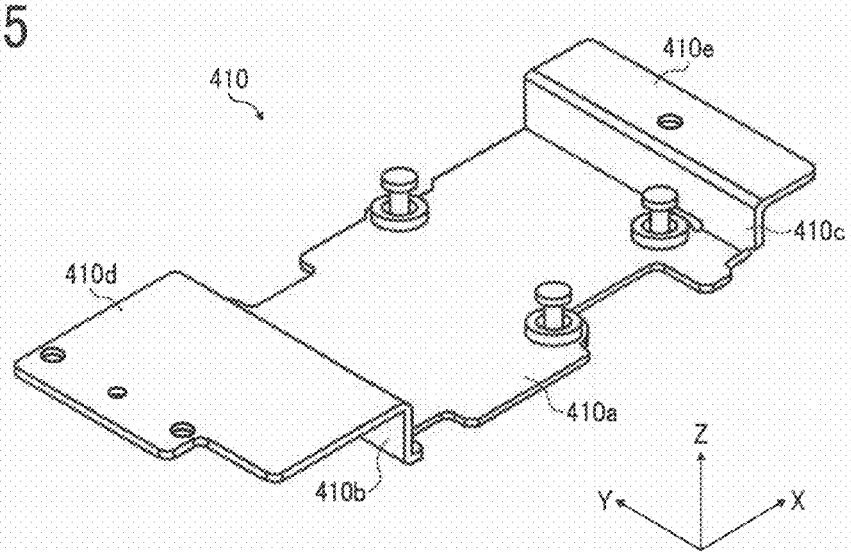
FIG. 15 is a perspective view illustrating the heat-transfer plate.
Figure 16A:
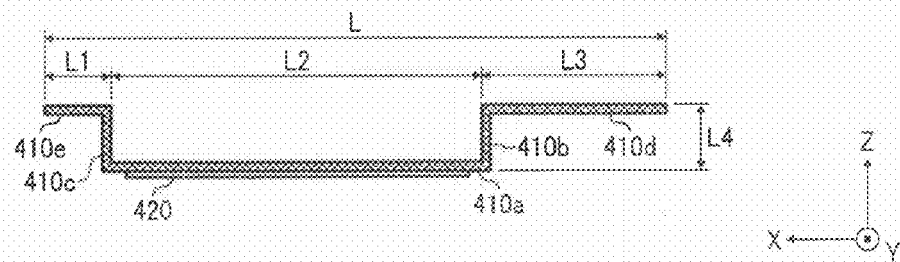
FIG. 16A is a front face view of the heat-transfer plate.
Figure 16B:
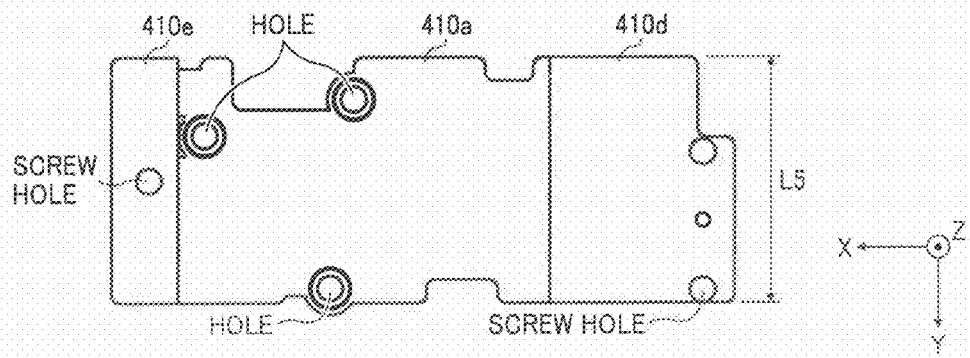
FIG. 16B is a plan view of the heat-transfer plate.

The heat-transfer plate 410 includes, as illustrated in FIGS. 15-16B, a bottom face portion 410a, two side wall portions 410b, 410c which extend from the both ends of the bottom face portion 410a in the X-axis direction to the Z-axis direction, a first heat-transfer portion 410d which extends from the +Z side end portion of the side wall portion 410b located on the −X side of the bottom face portion 410a to the −X direction and a second heat-transfer portion 410e which extends from the +Z side end portion of the side wall portion 410c located on the +X side of the bottom face portion 410a to the +X direction. In FIG. 16A, reference number L denotes 155 mm, reference number L1 denotes 15 mm, reference number L2 denotes 95 mm, reference number L3 denotes 45 mm and reference number L4 denotes 15 mm. In FIG. 16B, reference number L5 denotes 60 mm.

The bottom face portion 410a has a 0.5-mm-thick elastic heat-transfer sheet (heat release sheet) 420. The heat-transfer sheet 420 is attached to the −Z side face of the bottom face portion 410a.

Figure 17:
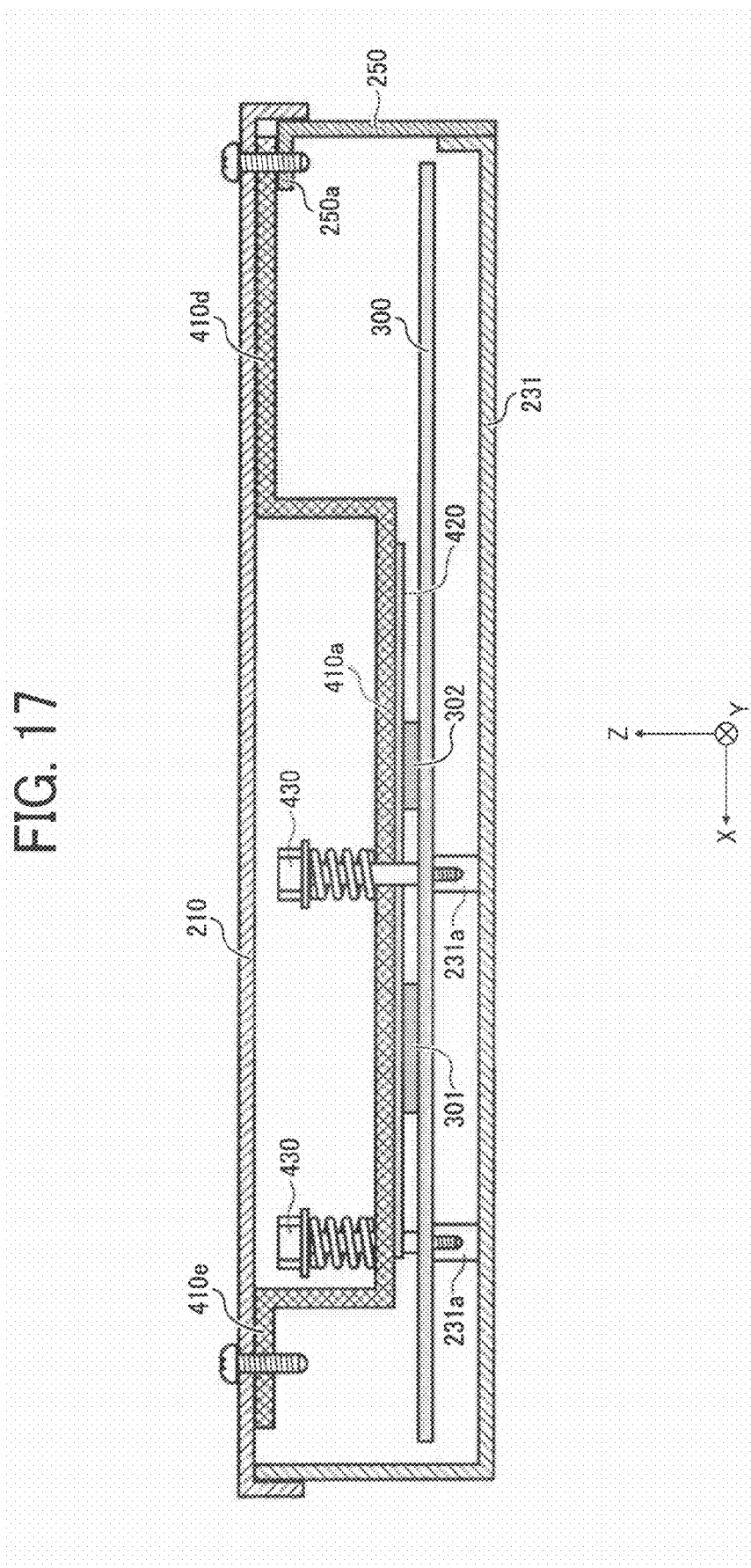
FIG. 17 is a view describing a state in which the heat-transfer plate is attached.

As illustrated in FIG. 16B, the bottom face portion 410a has three holes as an example. A stage screw 430 with spring is inserted into each hole of the bottom face portion 410a as illustrated in FIG. 17. Each stage screw 430 is threadably mounted on the support 231a of the lower cover 230. At this time, the bottom face portion 410a is pressed in the −Z direction by the elastic force of the spring of the stage screw. Then, the heat-transfer sheet 420 is closely attached to the CPU 301 and the chip set 302.

The first heat-transfer section 410d has on the −X side end portion a screw hole as illustrated in FIG. 16B. The −X side end portion of the first heat-transfer section 410d is screwed to the extended portion 250a of the front face panel 250 by the screw inserted into the hole provided in the top panel portion 211 of the upper cover 210.

Figure 18:
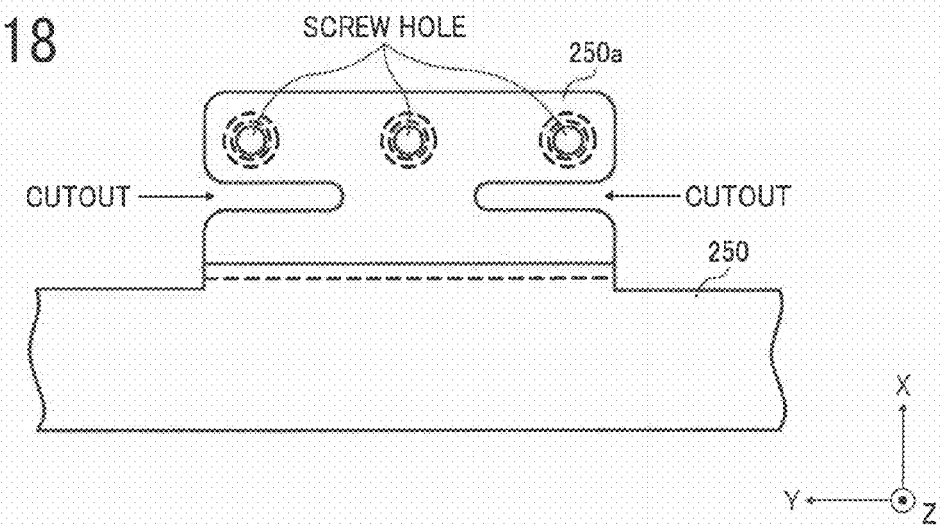
FIG. 18 is a view describing an extended portion of a front panel.

In the present embodiment, as illustrated in FIG. 18, the extended portion 250a of the front face panel 250 has a cutout parallel to the Y-axis direction. The cutout is formed on the −X side of the area where the screw hole is formed. By this configuration, the rigidity of the extended portion 250a becomes smaller than that of the heat-transfer plate 410. Consequently, the bottom face portion 410a of the heat-transfer plate 410 can be prevented from being screwed in an inclined state with respect to the CPU 301 and the chip set 302.

The second heat-transfer portion 410e is screwed near the +X side end portion of the top panel portion 211 of the upper cover 210.

Namely, the heat-transfer plate 410 is screwed to the housing 200 near both the end portions of the housing 200 in the X-axis direction.

With this configuration, the heat of the CPU 301 and the chip set 302 is transferred to the bottom face portion 410a via the heat-transfer sheet 420. The heat transferred to the bottom face portion 410a is transferred to the side wall portions 410b, 410c. The heat transferred to the side wall portion 410b is transferred to the top panel portion 211 of the upper cover 210 via the first heat-transfer portion 410d. The heat transferred to the side wall portion 410c is also transferred to the top panel portion 211 of the upper cover 210 via the second heat-transfer portion 410e.

In the present embodiment, the temperature of the CPU 301 and the chip set 302 does not exceed the upper limit value of a manufacturer's recommended temperature range.

As is apparent from the above description, in the information device 100 according to the present embodiment, the board of this embodiment is constituted by the main board 300. The heat-generating components of this embodiment are constituted by the CPU 301 and the chip set 302. The elastic member of this embodiment is constituted by the step screw with spring 430. The sheet member of this embodiment is constituted by the heat-transfer sheet 420.

As described above, the information device according to the embodiment of the present invention includes the main board 300 on which the CPU 301 and the chip set 302 are mounted, the housing 200 in which the main board 300 is housed and the heat-transfer plate 410 which transfers the heat of the CPU 301 and the chip set 302 mounted on the main board 300 to the housing 200.

The heat-transfer plate 410 includes the bottom face portion 410a which has contact with the CPU 301 and the chip set 302, the first heat-transfer portion 410d which is screwed near the −X side end portion of the housing 200, and the second heat-transfer portion 410e which is screwed near the +X side end portion of the housing 200.

By this configuration, the heat of the CPU 301 and the chip set 302 can be effectively transferred to the housing 200 without increasing the thickness of the housing 200, so that the information device 100 can be downsized and the thickness of the information device 100 can be reduced.

The elastic heat-transfer sheet 420 is attached to the −Z side face of the bottom face portion 410a. By this heat-transfer sheet 420, the heat of the CPU 301 and the chip set 302 is effectively transferred to the housing 200.

Moreover, the bottom face portion 410a is pressed in the −Z direction by the elastic force of the spring of the step screw. The heat-transfer sheet 420 can be thereby closely attached to the CPU 301 and the chip set 302, so that the heat of the CPU 301 and the chip set 302 can be effectively transferred to the housing 200.

The first heat-transfer portion 410d is screwed to the extended portion 250a of the front face panel 250 having rigidity smaller than that of the heat-transfer plate 410. Consequently, the bottom face portion 410a of the heat-transfer plate 410 can be prevented from being screwed in an inclined state to the CPU 301 and the chip set 302. More particularly, the bottom face portion 410a can be pressed to the CPU 301 and the chip set 302 by an equal force.

Figure 19A:
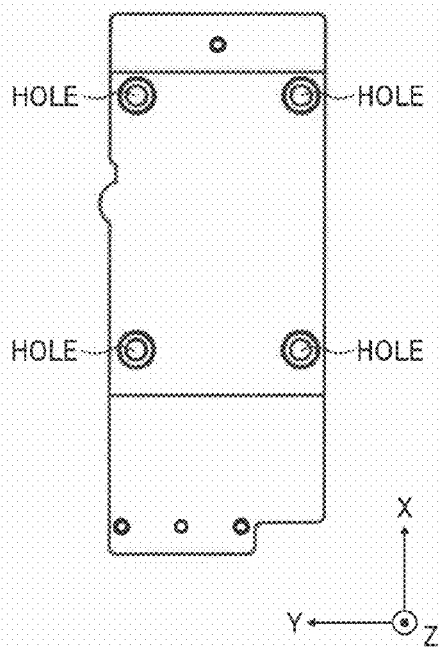
FIG. 19A is a view describing a modified example of the heat-transfer plate.
Figure 19B:
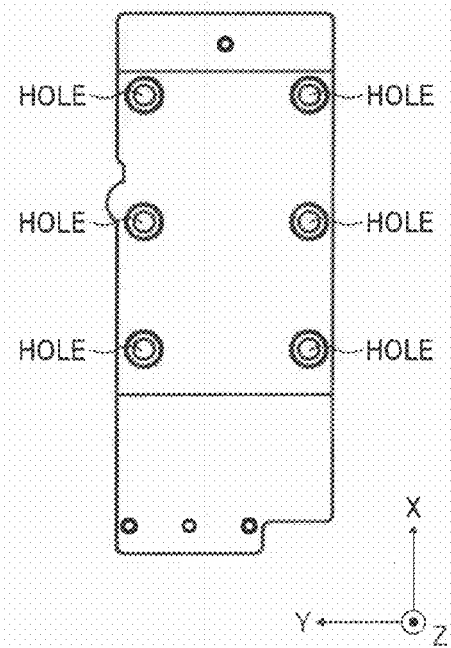
FIG. 19B is a view describing another modified example of the heat-transfer plate.

In the above embodiment, the bottom face portion 410a of the heat-transfer plate 410 has three holes; however, the number of holes formed on the bottom face portion 410a is not limited to the above. For example, as illustrated in FIGS. 19A, 19B, four holes or six holes can be formed on the bottom face portion 410a. The positions of the holes are not limited to the positions as described in the above embodiment.

In the above embodiment, two heat-generating components such as the CPU 301 and the chip set 302 are described, but the heat-generating components are not limited thereto.

In the above embodiment, the information device which is built in a digital signage is described, but the information device is not limited thereto. As long as the information device has a structure in which a board having heat-generating components is housed in a housing, the information device can be downsized and the thickness of the information device can be reduced by using the above-described heat-transfer mechanism.

In the above embodiment, a heat release fin can be formed on the bottom face portion 410a of the heat-transfer plate 410.

Figure 20:
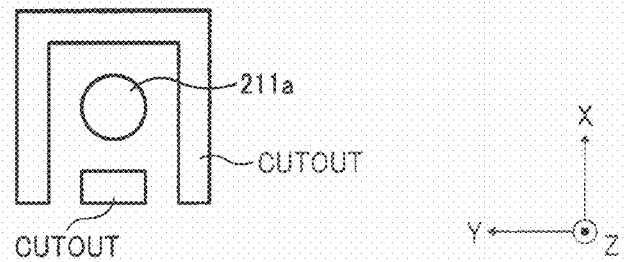
FIG. 20 is a view describing a cutout around a hole which is used for screwing a second heat-transfer portion to a top panel portion of the upper cover.

In the above embodiment, as illustrated in FIG. 20, a cutout can be formed around a hole 211a which is used for screwing the second heat-transfer portion 410e in the top panel portion 211 of the upper cover 210, such that the rigidity of the portion to which the second heat-transfer portion 410e is screwed becomes smaller than that of the heat-transfer plate 410. In this case, the bottom face portion 410a can be pressed to the CPU 301 and the chip set 302 by an equal force.

The size of the heat-transfer plate 410 in the above embodiment is an example, and the size is not limited thereto.

In the above embodiment, if the −Z side face of the bottom face portion 410a is closely attached to the CPU 301 and the chip set 302 without using the heat-transfer sheet, the heat-transfer sheet 420 can be omitted.

As described above, the heat-transfer mechanism of the above embodiment is suitable for effectively transferring heat of a heat-generating component to a housing without increasing the thickness of the housing, and also is suitable for downsizing and thinning the housing.

As described above, the information device can be downsized, and the thickness of the information device can be reduced.

Although the embodiment of the present invention has been described above, the present invention is not limited thereto. It should be appreciated that variations may be made in the embodiment described by persons skilled in the art without departing from the scope of the present invention.

What is claimed is:

1. A heat-transfer mechanism which transfers heat of a heat-generating component mounted on a board to a housing, comprising:
   a heat-transfer plate including:
      a bottom face portion which has contact with the heat-generating component;
      a first heat-transfer portion which is screwed near one end portion of the housing; and
      a second heat-transfer portion which is screwed near the other end portion of the housing, wherein
   the housing includes
      a case and a lid disposed on the case, and
      a first supporting portion to which the first heat-transfer portion is screwed,
   the first supporting portion is cantilevered from the housing,
   the first supporting portion includes a first section and a second section,
   a width of the second section is wider than a width of the first section,
   the width of the first section and the width of the second section extend in a direction transverse to a thickness direction of the first supporting portion,
   the lid of the housing has a second supporting portion to which the second heat-transfer portion is screwed, the second supporting portion is cantilevered from the housing, and an outer edge of the second supporting portion is defined by a first cutout through the lid.

2. The heat-transfer mechanism according to claim 1, wherein the board is attached to the case, and the first supporting portion extends from the case.

3. The heat-transfer mechanism according to claim 2, wherein the case includes a bottom plate portion, two side plate portions, a front face panel portion, and a back face panel portion, and the first supporting portion extends from the front face panel portion.

4. The heat-transfer mechanism according to claim 2, wherein the second supporting portion includes a third section and a fourth section, a width of the fourth section is wider than a width of the third section, and the width of the third section and the width of the fourth section extend in a direction transverse to a thickness direction of the second supporting portion.

5. The heat-transfer mechanism according to claim 4, wherein the second supporting portion includes a fifth section, the second supporting portion attaches to the housing through the third section and the fifth section, the third section and the fifth section are spaced apart by a distance, the width of the fourth section is wider than a width of the fifth section, and the width of the fifth section extends in the same direction as the width of the third section.

6. The heat-transfer mechanism according to claim 5, wherein the width of the fifth section is equal to the width of the third section.

7. The heat-transfer mechanism according to claim 5, wherein an inner edge of the third section and an inner edge of the fifth section is defined by a second cutout through the second supporting portion.

8. The heat-transfer mechanism according to claim 2, wherein the bottom face portion is screwed to the bottom plate portion of the case across the board.

9. The heat-transfer mechanism according to claim 1 comprising an elastic member which presses the bottom face portion to the heat-generating component.

10. The heat-transfer mechanism according to claim 1, wherein the bottom face portion has contact with the heat-generating component via a sheet member having an elastic force and a heat conductivity.

11. An information device, comprising:

a board on which a heat-generating component is mounted;

a housing in which the board is housed; and a heat-transfer mechanism which transfers heat of the heat-generating component to the housing according to claim 1.

12. The heat-transfer mechanism according to claim 1, wherein the first supporting portion includes a third section, whereby the first supporting portion attaches to the housing, the first section is disposed between the third section and the second section, a width of the third section is greater than the width of the first section, and the width of the third section extends in the same direction as the width of the second section.

13. The heat-transfer mechanism according to claim 12, wherein the width of the third section is equal to the width of the second section.

14. The heat-transfer mechanism according to claim 1, wherein at least one outer edge of the first section is defined by at least one cutout.

* * * * *